United States Patent
Samuelson et al.

(10) Patent No.: US 8,242,481 B2
(45) Date of Patent: Aug. 14, 2012

(54) NANOWHISKERS WITH PN JUNCTIONS, DOPED NANOWHISKERS, AND METHODS FOR PREPARING THEM

(75) Inventors: Lars Ivar Samuelson, Malmo (SE); Bjorn Jonas Ohlsson, Malmo (SE); Lars-Ake Ledebo, Lund (SE)

(73) Assignee: QuNano AB, Lund (SE)

( * ) Notice: Subject to any disclaimer, the term of this patent is extended or adjusted under 35 U.S.C. 154(b) by 0 days.

(21) Appl. No.: 13/352,533

(22) Filed: Jan. 18, 2012

(65) Prior Publication Data

US 2012/0126200 A1 May 24, 2012

Related U.S. Application Data

(60) Continuation of application No. 13/033,111, filed on Feb. 23, 2011, now Pat. No. 8,120,009, which is a continuation of application No. 12/230,086, filed on Aug. 22, 2008, now Pat. No. 7,910,492, which is a division of application No. 10/814,630, filed on Apr. 1, 2004, now Pat. No. 7,432,522.

(60) Provisional application No. 60/459,990, filed on Apr. 4, 2003.

(51) Int. Cl.
 *H01L 29/06* (2006.01)

(52) U.S. Cl. .......................... 257/12; 438/758

(58) Field of Classification Search .................... 257/12, 257/9, 14, 13, 29, 232, E21.109, E21.152, 257/E29.341
See application file for complete search history.

(56) References Cited

U.S. PATENT DOCUMENTS

| | | | |
|---|---|---|---|
| 5,196,396 A | 3/1993 | Lieber | |
| 5,252,835 A | 10/1993 | Lieber et al. | |
| 5,332,910 A | 7/1994 | Haraguchi et al. | |
| 5,362,972 A | 11/1994 | Yazawa et al. | |
| 5,381,753 A | 1/1995 | Okajima et al. | |
| 5,544,617 A | 8/1996 | Terui et al. | |
| 5,840,435 A | 11/1998 | Lieber et al. | |
| 5,858,862 A | 1/1999 | Westwater et al. | |
| 5,897,945 A | 4/1999 | Lieber et al. | |
| 5,899,734 A | 5/1999 | Lee | |
| 5,976,957 A | 11/1999 | Westwater et al. | |
| 5,997,832 A | 12/1999 | Lieber et al. | |

(Continued)

FOREIGN PATENT DOCUMENTS

EP 0 443 920 8/1991

(Continued)

OTHER PUBLICATIONS

U.S. Appl. No. 11/922,243, filed Jun. 16, 2006, Wemersson et al.

(Continued)

*Primary Examiner* — Thao P. Le

(74) *Attorney, Agent, or Firm* — The Marbury Law Group PLLC

(57) ABSTRACT

Nano-engineered structures are disclosed, incorporating nanowhiskers of high mobility conductivity and incorporating pn junctions. In one embodiment, a nanowhisker of a first semiconducting material has a first band gap, and an enclosure comprising at least one second material with a second band gap encloses said nanoelement along at least part of its length, the second material being doped to provide opposite conductivity type charge carriers in respective first and second regions along the length of the of the nanowhisker, whereby to create in the nanowhisker by transfer of charge carriers into the nanowhisker, corresponding first and second regions of opposite conductivity type charge carriers with a region depleted of free carriers therebetween.

7 Claims, 7 Drawing Sheets

U.S. PATENT DOCUMENTS

| | | | |
|---|---|---|---|
| 6,130,142 | A | 10/2000 | Westwater et al. |
| 6,130,143 | A | 10/2000 | Westwater et al. |
| 6,159,742 | A | 12/2000 | Lieber et al. |
| 6,190,634 | B1 | 2/2001 | Lieber et al. |
| 6,286,226 | B1 | 9/2001 | Jin |
| 6,307,241 | B1 | 10/2001 | Awschalom et al. |
| 6,322,713 | B1 | 11/2001 | Choi et al. |
| 6,340,822 | B1 | 1/2002 | Brown et al. |
| 6,559,468 | B1 | 5/2003 | Kuekes et al. |
| 6,586,965 | B2 | 7/2003 | Kuekes |
| 6,716,409 | B2 | 4/2004 | Hafner et al. |
| 6,743,408 | B2 | 6/2004 | Lieber et al. |
| 7,014,737 | B2 | 3/2006 | Harutyunyan et al. |
| 7,208,094 | B2 | 4/2007 | Islam et al. |
| 7,223,444 | B2 | 5/2007 | Deppert et al. |
| 7,335,908 | B2 | 2/2008 | Samuelson et al. |
| 7,354,850 | B2 | 4/2008 | Seifert et al. |
| 8,143,658 | B2 * | 3/2012 | Samuelson et al. ............ 257/300 |
| 8,183,566 | B2 * | 5/2012 | Kobayashi et al. ............. 257/51 |
| 8,183,587 | B2 * | 5/2012 | Samuelson et al. ............. 257/98 |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2003/0089899 | A1 | 5/2003 | Lieber et al. |
| 2003/0102444 | A1 | 6/2003 | Deppert et al. |
| 2003/0121764 | A1 | 7/2003 | Yang et al. |
| 2003/0200521 | A1 | 10/2003 | DeHon et al. |
| 2004/0213307 | A1 | 10/2004 | Lieber et al. |
| 2005/0006673 | A1 | 1/2005 | Samuelson et al. |
| 2005/0011431 | A1 | 1/2005 | Samuelson et al. |
| 2005/0017171 | A1 | 1/2005 | Samuelson et al. |
| 2005/0161662 | A1 * | 7/2005 | Majumdar et al. ............. 257/18 |
| 2006/0057360 | A1 | 3/2006 | Samuelson et al. |
| 2006/0125056 | A1 | 6/2006 | Samuelson et al. |
| 2007/0206488 | A1 * | 9/2007 | Thelander et al. ............ 369/288 |
| 2007/0228583 | A1 | 10/2007 | Islam et al. |

FOREIGN PATENT DOCUMENTS

| | | |
|---|---|---|
| EP | 0 838 865 | 4/1998 |
| EP | 1 314 189 | 5/2003 |
| EP | 1 342 075 | 9/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/080280 | 10/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |

OTHER PUBLICATIONS

U.S. Appl. No. 11/922,242, filed Jun. 16, 2006, Wernersson et al.
U.S. Appl. No. 11/868,122, filed Oct. 5, 2007, Samuelson et al.
U.S. Appl. No. 11/812,226, filed Jun. 15, 2007, Samuelson et al.
U.S. Appl. No. 11/812,225, filed Jun. 15, 2007, Samuelson et al.
U.S. Appl. No. 10/613,071, filed Jul. 7, 2003, Samuelson et al.
U.S. Appl. No. 11/003,738, filed Dec. 31, 2007, Samuelson et al.
U.S. Appl. No. 12/003,988, filed Jan. 4, 2008, Seifert et al.
U.S. Appl. No. 12/003,741, filed Dec. 31, 2007, Samuelson et al.
U.S. Appl. No. 12/003,740, filed Dec. 31, 2007, Samuelson et al.
U.S. Appl. No. 12/003,739, filed Dec. 31, 2007, Samuelson et al.
U.S. Appl. No. 12/003,738, filed Dec. 31, 2007, Samuelson et al.
Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.
Haraguchi, K. et al., "GaAs p-n junction formed in quantum wire crystals", *Applied Physics Letters*, Feb. 10, 1992, pp. 745-747, vol. 60. No. 6.
Yazawa, M., et al., "Effect of one monolayer of surface gold atoms on the epitaxial growth of InAs nanowhiskers", *Applied Physics Letters*, Oct. 26, 1992, pp. 2051-2053, vol. 61.
Yazawa, M., "Nanocolumns composed of GaAs-InAs jointed whiskers and Si02 covers", *Applied Physics Letters*, Aug. 29, 1994, pp. 1157-1158, vol. 65.
Sato, T., "Site-controlled growth of nanowhiskers", *Applied Physics Letters*, Jan. 9, 1995, pp. 159-161, vol. 66.
Hiruma, K., et al., "Growth and optical properties of nanometerscale GaAs and InAs whiskers", *Applied Physics Review*, Jan. 15, 1995, pp. 447-462, vol. 77.
Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.
Hiruma, K., et al., "Gas free-standing quantum-size wires", *Journal of Applied Physics*, Sep. 1, 1993, pp. 3162-3171, vol. 74.
Haraguchi, K., et al., "Polarization dependence of light emitted from GaAs p-n junctions in quantum wire crystals", *Journal of Applied Physics*, Apr. 15, 1994, pp. 4220-4225, vol. 75.
Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.
Lieber, C., "Nanowires as Building Blocks for Nanoscale Science and Technology", *Abstracts of Papers of the Amer. Chem Soc.*, Aug. 18, 2002, pp. 033-Camp Part 1, vol. 224.
Duan, X. et al., "Laser Assisted Catalytic Growth of Single-Crystal Compound Semiconductor Nanowires", *Abstracts of Papers of- the Amer. Chem. Soc.*, Mar. 26, 2000, pp. 676-Inor Part 1, vol. 219.
Duan, X. et al., "Laser Assisted Catalytic Growth of Semiconductor Nanowires for Nanoscale Electronic Optoelectronic Device Application", *Abstracts of Pacers of- the Amer. Chem. Soc.*, Apr. 1, 2001, pp. 644-Inor Part 1, vol. 221.
Lieber, C., "Semiconductor Nanowires: Building Blocks for Nanoscale Science and Technology", *Abstracts of Papers of- the Amer. Chem. Soc.*, Aug. 1, 2001, pp. 383-Phys Part 2, vol. 222.
Huang, Y., et al., "Integrated Optoelectronics Assembled from Semiconductor Nanowires", *Abstracts of Papers of- the Amer. Chem. Soc.*, Aug. 18, 2002, pp. 039-Phys Part 2, vol. 224.
Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.
Duan, X. et al., "General Synthesis of Compound Semiconductor Nanowires", *Advanced Materials*, Jan. 1, 2000, pp. 298-302, vol. 12, No. 4.
Duan, X., et al., "Synthesis and optical properties of gallium arsenide nanowires", *Applied Physics Letters*, Feb. 28, 2000, pp. 1116-1118, vol. 76, No. 9.
Cui, Y., et al., "Diameter-controlled synthesis of single-crystal silicon nanowires", *Applied Physics Letters*, Apr. 9, 2001, pp. 2214-2216, vol. 78, No. 15.
Gudiksen, M.S., et al., "Diameter-selective synthesis of semiconductor nanowires", *J. Am. Chem. Soc.*, Aug. 22, 2000, pp. 8801-8802, vol. 122.
Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.
Duan, X., et al., "Laser-Assisted Catalytic Growth of Single Crystal GaN Nanowires", *Journal of Amer. Chem. Soc.*, Dec. 18, 1999, pp. 188-189, vol. 122, No. 1.
Huang, Y., et al., "Gallium Nitride Nanowire Nanodevices", *Nano Letters*, Jan. 11, 2002, pp. 81-82, vol. 2, No. 2.
Lieber, C., "Nanowire Sugerlattices", *Nano Letters*, Jan. 25, 2002, pp. 82-82, vol. 2, No. 2.
Duan, X., et al., "Nonvolatile Memory and Programmable Logic from Molecule-Gated Nanowires", *Nano Letters*, May 1, 2002, pp. 487-490, vol. 2, No. 5.
Cui, Y., et al., "High Performance Silicon Nanowire Field Effect Transistors", *Nano Letters*, Jan. 1, 2003, pp. 149-152, vol. 3, No. 2.
Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunnelling quantum dot stacks", *Applied Physics Letters*, May 21, 2001, pp. 3232-3234, vol. 78, No. 21.

Thelander, et al., "Gold manoparticle single-electron transistor with carbon nanotube leads", *Applied Physics Letters*, Sep. 24, 2001, pp. 2106-2108, vol. 79, No. 13.

Ohlsson, B.J., et al., "Size-, shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P. et al., "Electronic Structure of Nanometer-Scale GaAs Whiskers", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters*, Sep. 8, 2003, pp. 2052-2054, vol. 83, No. 10.

Panev, N., et al., "Sharp Exciton Emission From Single InAs Quantum Dots in GaAs Nanowires", *Applied Physics Letters*, Sep. 15, 2003, pp. 2238-2240, vol. 83, No. 11.

Bjork, M.T., "Nanowire resonant tunnelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology, Lund University*, Nov. 23, 2001.

Thelander, C., "Quantum Devices from the Assembly of Zero-and One-Dimensional Building Blocks", *Doctoral Thesis, Lund University*, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al., "Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers", *MSS10 Conference—Austria*, Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, No. 2.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Samuelson, L., et al., "Tunnel-Induced Photon Emission in Semiconductors Using an STM", *Physica Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis, Lund University*, Aug. 1, 2002.

Bjork, M., "Semiconductor Nanowires and Devices", *Tekn lic thesis, Lund University*, Nov. 1, 2002.

Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", IEEE Spectrum, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.

Matthews, J., et al., "Defects in Epitaxial Multillayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.

Hara, S., et al, "Formation and Photoluminescence Characterization of Quantum Well Wires Using Multiatomic Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iijima, S., "Helical microtubules of graphitic carbon", *Nature*, Nov. 7, 1991, pp. 56-58, vol. 354.

Yao, Z., et al., "Carbon Nanotube Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si-Ge multilayers using high-resolution electron microscopy imaging and direct digital recording", Ultramicroscopy, Jan. 1, 1996, pp. 221-235, vol. 66.

Wagner. R.S., "VLS Mechanism of Crystal Growth", *Whisker Technology*, A.P. Levitt, ed., Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "For the discovery of the quantized Hall Effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AIGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, Mar. 2003, Mar. 1, 2003.

Wu, Y., et al., "Rational Synthesis of Inorganic Nanowires", *Abstracts of Papers in the Amer. Chem. Soc.*, Apr. 1, 2001, pp. 108-lec Part 1, vol. 221.

Yang, P., et al., "Nanowires from Vapor Condensation and their Assemblies", *Abstracts of Papers in the Amer. Chem. Soc.*, Mar. 26, 2000, pp. 269-Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95-Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343-Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry-A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo$_3$Se$_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using Mo$_3$Se$_3$-as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanolasers", *Science*, Jun. 6, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 Substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO" *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems" *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors", *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Review B*, vol. 57, Jan. 22, 2003, pp. 033407-1-033407-4.

Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp. 1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett*, vol. 64. No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-µm-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

Westwater et al., "Growth of Silicon Nanowires Via Gold/Silane Vapor-Liquid-Solid Reaction", *J. Vac. Sci. Technol. B.*, vol. 15, No. 3, 1997, pp. 554-557.

Kamins et al., "Ti-Catalyzed Si Nanowires by Chemical Vapor Deposition: Microscopy and Growth Mechanisms", *Journal of Applied Physics*, vol. 89, No. 2, Jan. 15, 2001, pp. 1008-1016.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown Via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C.", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.

Abramson et al., "Nanowire Composite Thermoelectric Devices", *Proceedings of IMECE2002, ASME International Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", *Proceedings of HT2003. ASME Summer Heat Transfer Conference*, Jul. 21-23, 2003, pp. 101-104.

Choi et al., "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{o.25}In_{o.75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of 7th International Conference of Nanometer-Scale Science and Technology and 21st European Conference on Surface Science*, Jun. 24, 2002.

Ohlsson et al., "Comparison Between (111)B and (100)III-V Nanowhiskers", Proceedings of 7th International Conference of Nanometer-Scale Science and Technology and 21st European Conference on Surface Science, Jun. 24, 2002.

Larsson et al, In-Situ Manipulations and Electrical Measurements of III-V Nanowhiskers with TEM-STM, Proceedings of 7th International Conference of Nanometer-Scale Science and Technology and 21st European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Field-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol. 4, No. 10, Sep. 14, 2004, pp. 1961-1964.

Hayakawa et al., "AlGaAs Nano-Meter Scale Network Structures Fabricated by Selective Area MOVPE," Inst. Phys. Conf. Ser., No. 162, Chapter 8, Oct. 12, 1998, pp. 415-419.

Kempa et al., "Photonic Crystals Based on Periodic Arrays of Aligned Cabon Nanotubes," Nano Letters, vol. 3, No. 1, Nov. 19, 2002, pp. 13-18.

Akabori et al., "InGaAs Nano-Pillar Array Formation on Partially Masked InP(111)B by Selective Area Metal-Organic Vapor Phase Epitaxial Growth for Two-Dimensional Photonic Crystal Application," Nanotechnology, No. 14, Aug. 27, 2003, pp. 1071-1074.

Xia et al., "One-Dimensional Nanostructures: Synthesis, Characterization, and Applications," Avd. Mater., vol. 15, No. 5, Mar. 4, 2003, pp. 353-389.

Yan et al., "Dendritic Nanowire Ultraviolet Laser Array," J. Am. Chem., Soc., vol. 125, Mar. 29, 2003, pp. 4728-4729.

\* cited by examiner

LENGTH: 1.9 MICRON
THICKNESS: 95-130 nm

—100nm
nm-1ab    10KU    X40,000    14mm

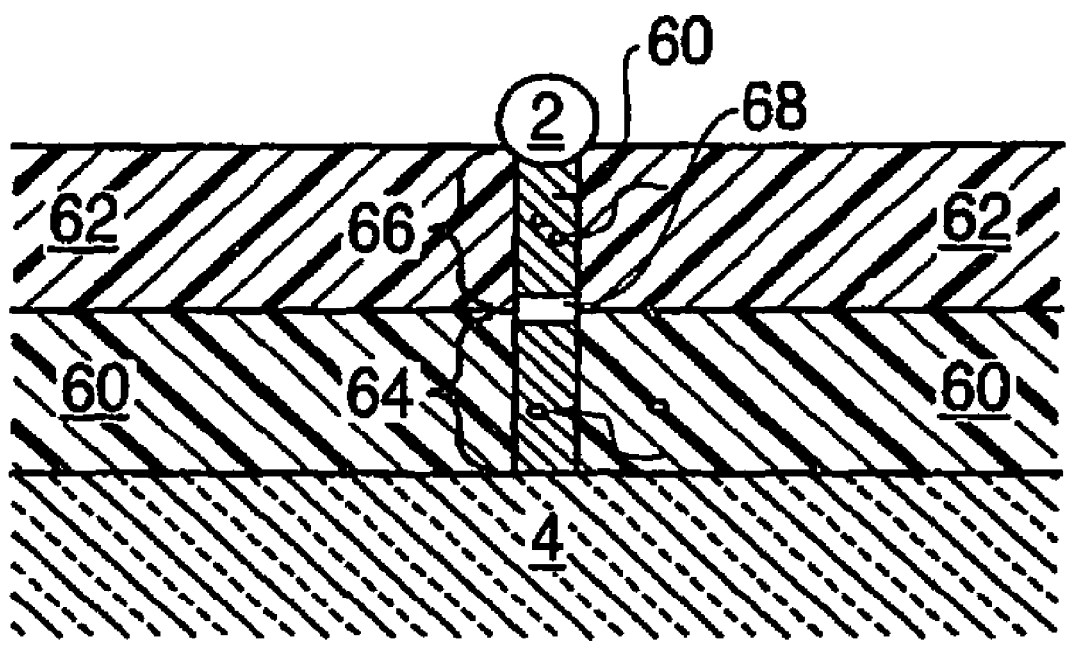
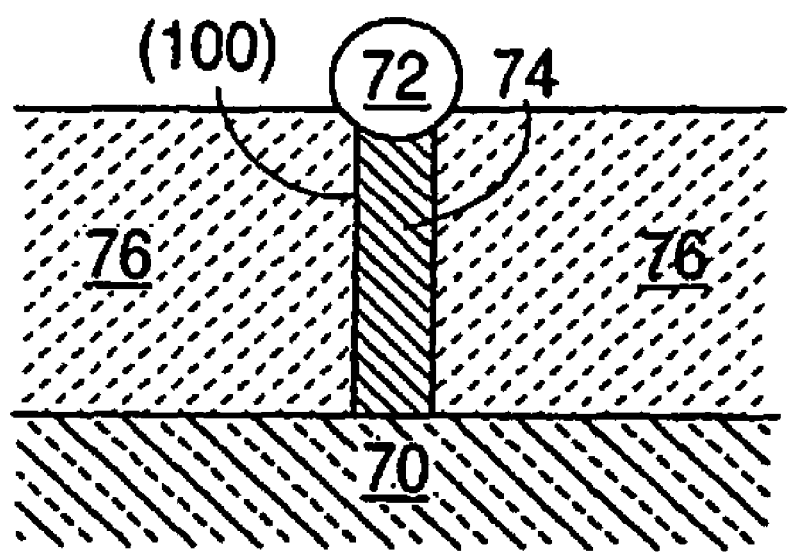

NANOWHISKERS WITH PN JUNCTIONS, DOPED NANOWHISKERS, AND METHODS FOR PREPARING THEM

CROSS-REFERENCE TO RELATED APPLICATIONS

This application is a Continuation of U.S. application No. 13/033,111, filed Feb. 23, 2011, which is a Continuation of U.S. application No. 12/230,086,filed Aug. 22, 2008,now U.S. Pat. No. 7,910,492, which is a Divisional of U.S. application No. 10/814,630,filed Apr. 1, 2004, now U.S. Pat. No 7,432,522, which claims the benefit priority of U.S. Provisional Patent Application No. 60/459,990 filed Apr. 4, 2003, the entirety of all of which are incorporated herein by reference.

BACKGROUND OF THE INVENTION

1. Field of the Invention

This invention relates generally to structures and devices produced by techniques of nanotechnology.

More specifically, the invention relates to such structures and devices incorporating at least one element, essentially in one-dimensional form, and that is of nanometer dimensions in its width or diameter, and that preferably is produced by the so-called Vapor-Liquid-Solid (VLS) mechanism. For the purposes of this specification, such element will be termed a "nanowhisker".

2. Brief Description of the Prior Art

Nanotechnology covers various fields, including that of nanoengineering, which may be regarded as the practice of engineering on the nanoscale. This may result in structures ranging in size from small devices of atomic dimensions, to much larger scale structures for example on the microscopic scale. Commonly, such structures include nanostructures. In certain contexts nanostructures are considered to be those having at least two dimensions not greater than about 100 nm, with some authors using the term to identify structures having at least two dimensions not greater than about 200 nm. Nevertheless, some procedures for fabricating such small structures are useful for structures having at least two dimensions somewhat greater, e.g., structures having at least two dimensions not greater than about 1 micrometer (μm). Ordinarily, layered structures or stock materials having one or more layers with a thickness less than 1 μm are not considered to be nanostructures. Thus, although the term "nanostructure" is more classically considered to refer to structures having at least two dimensions not greater than about 100 nm, in the following discussion, the term "nanostructure", "nanowhisker", or "nanoelement" is intended to include a structure having at least two dimensions not greater than about 1 μm.

Nanostructures include so-called one-dimensional nanoelements, essentially in one-dimensional form, that are of nanometer dimensions in their width or diameter, and that are commonly known as nanowhiskers, nanorods, nanowires, nanotubes, etc.

As regards nanowhiskers, the basic process of whisker formation on substrates, by the so-called VLS (vapor-liquid-solid) mechanism, is well known. A particle of a catalytic material, usually gold, for example, on a substrate is heated in the presence of certain gases to form a melt. A pillar forms under the melt, and the melt rises up on top of the pillar. The result is a whisker of a desired material with the solidified particle melt positioned on top. (See E. I Givargizov, *Current Topics in Materials Science*, Vol. 1, pages 79-145, North Holland Publishing Company, 1978.) The dimensions of such whiskers were in the micrometer range.

Although the growth of nanowhiskers catalyzed by the presence of a catalytic particle at the tip of the growing whisker has conventionally been referred to as the VLS (Vapor-Liquid-Solid) process, it has come to be recognized that the catalytic particle may not have to be in the liquid state to function as an effective catalyst for whisker growth. At least some evidence suggests that material for forming the whisker can reach the particle-whisker interface and contribute to the growing whisker even if the catalytic particle is at a temperature below its melting point and presumably in the solid state. Under such conditions, the growth material, e.g., atoms that are added to the tip of the whisker as it grows, may be able to diffuse through a the body of a solid catalytic particle or may even diffuse along the surface of the solid catalytic particle to the growing tip of the whisker at the growing temperature. Evidently, the overall effect is the same, i.e., elongation of the whisker catalyzed by the catalytic particle, whatever the exact mechanism may be under particular circumstances of temperature, catalytic particle composition, intended composition of the whisker, or other conditions relevant to whisker growth. For purposes of this application, the term "VLS process", "VLS method", or "VLS mechanism", or equivalent terminology, is intended to include all such catalyzed procedures wherein nanowhisker growth is catalyzed by a particle, liquid or solid, in contact with the growing tip of the nanowhisker.

International Application Publication No. WO 01/84238 discloses in FIGS. 15 and 16 a method of forming nanowhiskers wherein nanometer sized particles from an aerosol are deposited on a substrate and these particles are used as seeds to create filaments or nanowhiskers.

For the purposes of this specification the term nanowhiskers is intended to mean "one-dimensional" nanoelements with a width or diameter (or, generally, a cross-dimension) of nanometer size, the elements having been formed by the so-called VLS mechanism. Nanowhiskers are also referred to in the art as "nanowires" or, in context, simply as "wires", and such terminology, as used in this application, is equivalent to the term "nanowhiskers".

Several experimental studies on the growth of nanowhiskers have been made, including those reported by Hiruma et al. They grew III-V nano-whiskers on III-V substrates in a metal organic chemical vapor deposition (MOCVD) growth system. (See K. Hiruma, et al., *J. Appl. Phys.* 74, page 3162 (1993); K. Hiruma, et al., *J. Appl. Phys.* 77, page 447 (1995); K. Hiruma, et al., *IEICE Trans. Electron.* E77C, page 1420 (1994); K. Hinuna, et al., *J. Crystal Growth* 163, pages 226-231 (1996)).

Hiruma et al. have made pn junctions within nanowhiskers by doping GaAs whiskers with Si using $Si_2H_6$, during the growth process, and switching the dopant to an opposite conductivity type (carbon) during growth: K. Hiruma et al., *J. Appl. Phys.* 77(2), 15 Jan. 1995 p. 447, see pages 459-461; and K. Hiruma et al *J. Appl. Phys.* 75(8) 4220 (1994). In general, there are problems in that the definition of the junction within the nanowire is not good enough for electrical components, and in that the presence of dopant ions within the crystal creates crystal imperfections and reduces carrier mobility.

In another approach by Lieber et al, WO-A-03/005450, nanowires were produced, different wires being doped with opposite conductivity type dopants, and two wires of opposite conductivity type were physically crossed, one on top of the other, so that a pn junction was formed at their point of contact. A difficulty with this approach is the extra step required of physically positioning the nanowires.

In planar semiconductor processing, various doping techniques are known. One technique that is valuable with heterojunctions is known as modulation doping. In this technique, carriers from a doped layer of, e.g., AlGaAs, diffuse across an interface with an undoped material, e.g., GaAs, and form a very thin layer of carriers of very high mobility, within a potential well, next to the interface—see for example FIG. 1 of WO 02/19436.

U.S. Pat. No. 5,362,972 discloses an FET wherein the current flowpath between source and drain is composed of GaAs nanowhiskers. The nanowhiskers are surrounded by n-doped AlGaAs, to create by modulation doping a one-dimensional electronic gas within each nanowhisker.

WO 02/020820 discloses a modulation doping technique in Coaxial Heterostructure Nanowires, wherein dopants in an outer coaxial layer donate free carriers to an inner nanowire.

In other techniques, doping of a semiconductor region in a planar semiconductor device occurs by diffusion of ions from an adjacent region of polymer; see Guk et al., Semiconductors Vol. 33(3), pp. 265-275, March 1999.

In co-pending U.S. patent application Ser. No. 10/613,071, filed on Jul. 7, 2003, in the names of Samuelson and Ohlsson, the contents of which are incorporated herein by reference, a process was disclosed for producing nanowhiskers, and structures were disclosed incorporating nanowhiskers.

SUMMARY OF THE INVENTION

It is an object of the invention to provide new and improved nano-engineered structures incorporating nanowhiskers and other one-dimensional nanoelements, the nanoelements having improved conductivity characteristics.

It is a further object of the invention to provide new and improved nano-engineered structures incorporating nanowhiskers and other one-dimensional nanoelements, wherein the nanoelements contain improved pn junctions.

In at least a preferred embodiment of the invention, nanowhiskers or other one-dimensional nanoelements are grown as pure crystals without doping. The nanowhisker is then enclosed in an enclosure comprising a surrounding layer or matrix of a further different material that will usually be a semiconductor material. Dopant ions are incorporated into this further material, by an appropriate process during or after its deposition. Carriers liberated in the further material transfer into the nanowhisker. The band structures of the nanoelement and the further material ensure that it is energetically favorable for the carriers to diffuse into the nanoelement; this is effectively by the process known as modulation doping wherein a potential well is defined within the nanowhisker. Thus effectively the nanowhisker is doped with carriers, but that these are of high mobility, since the absence of dopant ions within the nanowhisker ensures that the crystalline structure is not deformed.

The preferred embodiment provides a method of producing a one-dimensional nanoelement of desired conductivity, the method comprising the steps of (1) forming a one-dimensional nanoelement of a first material, (2) surrounding the nanoelement with a second material, different from that of the nanoelement, the second material containing dopant material whereby charge carriers from the dopant material diffuse into the nanowhisker to create said desired conductivity. More specifically, the method comprises the steps of (1) forming by the VLS method a nanowhisker on a substrate, the nanowhisker including a first semiconducting material, and (2) forming a coaxial layer around the nanowhisker of a second semiconducting material, and (3) incorporating dopant material into the coaxial layer whereby charge carriers from the dopant material diffuse into the nanowhisker to create said desired conductivity.

The invention provides a means of creating a pn junction within a one-dimensional nanoelement by modulation doping.

Specifically the invention provides a nanoengineered structure including a one-dimensional nanoelement of a first semiconducting material having a first bandgap, an enclosure comprising at least one second material having a second bandgap enclosing said nanoelement along at least part of its length, and said second material being doped to provide opposite conductivity type charge carriers in respective first and second regions along the length of the of the nanowhisker, whereby to create by transfer of charge carriers into said nanoelement, corresponding first and second regions of opposite conductivity type charge carriers with a pn junction therebetween in said nanoelement, and wherein the bandgaps are such that it is energetically favorable for the charge carriers to remain in said nanoelement.

The enclosure for the nanoelement may be a coaxial jacket. In one preferred form a thin nanowhisker of GaAs is grown, then the growth conditions are changed from those appropriate for catalytic growth to those appropriate for bulk growth, so that a coaxial jacket is formed around the sides of the nanowhisker. The material may be AlGaAs. It is necessary to dope the lower part of the AlGaAs jacket with one conductivity type dopant material, and the upper parts of the coaxial jacket with opposite conductivity dopant ions. One exemplary technique for achieving this is to embed the coaxial jacket within a polymer matrix comprising upper and lower layers as, for example, spin on glass or polymer substances. The lower layer has one conductivity type dopant material, and the upper layer has the opposite conductivity type dopant material. Rapid thermal annealing causes diffusion of the dopant material into the coaxial jacket. The thermal annealing step is stopped before appreciable diffusion into the one-dimensional nanoelement. The presence of the dopant ions within the coaxial jacket creates modulation doping within the nanowhisker, and a pn junction between the two regions of opposite conductivity type material. The space charge within each region is maintained within the nanoelement, and the depletion region of the pn junction may be sharp or as diffuse as desired (typically within the range 50 nm to 1 μm). The diameter of the nanowhisker is preferably small, about 20 nm. The coaxial jacket may be as small as 10 nm thick, but it may in other cases be preferable to have a jacket that is 200 nm thick or one that even fills the volume between the nanowires completely in an array of nanowires.

The materials of the nanowire and jacket may be GaAs and AlGaAs, for example. Other material combinations could be InAs in the core section and AlSb in the surrounding material or a germanium core and a silicon jacket.

In a modification, the coaxial jacket is doped in one conductivity type during its formation. A layer of spin-on glass is then formed partway along the length of the nanowire, containing opposite type conductivity ions, that are sufficiently concentrated to reverse the conductivity type in the lower part of the coaxial jacket. In a further modification, the coaxial jacket is grown in an undoped condition, and a layer of spin-on glass is then formed partway along the length of the nanowire, containing one type conductivity ions. The structure is then exposed to a gas containing opposite type conductivity ions that diffuse into the upper part of the coaxial jacket, where they create a region of opposite conductivity type. The ions in the gas also diffuse into the layer of spin on glass, but not in a sufficient concentration to overcome the existing concentration of the one type conductivity. A pn junction is thereby formed in the nanowire.

In an alternative form, the one-dimensional nanoelement is encapsulated within an enclosure formed by first and second layers of polymer material or spin on glass, each layer having opposite conductivity dopant material. Direct charge transfer of the carriers from the polymer matrix creates modulation doping within the nanowhisker, and two separate regions of oppositely signed charge carriers with a pn junction between them.

In a further alternative form of the invention the doping is so heavy as to create degenerate doping within the nanoelement, that is to say the Fermi level exists, in one region, in the conduction band, and in the other region, in the valence band. In this state, the nanoelement comprises a tunnel diode or Esaki diode wherein in known manner, forward biasing of the junction creates a negative resistance caused by tunnelling between the valence and the conduction bands.

In a further aspect, a nanowhisker or other one-dimensional nanoelement is surrounded by a material containing dopant ions. For example the surrounding material may be a polymer material. By a process, for example a subsequent step of rapid thermal annealing, the dopant ions in the matrix material are permitted themselves to diffuse into the nanowhisker, to create a desired conductivity. This provides advantages over a direct doping into the nanoelement, by providing an extra degree of control over the doping process, and permitting the diffusion of certain dopants into the nanoelement that would not be possible by a more direct process. Although a polymer material is preferred, which is evaporated or spun onto a substrate so as to surround the nanowhisker, other materials may be employed, such as for example semiconductor material or dielectric material grown onto the substrate. The dopant material may be incorporated in the surrounding material before application to the substrate, during the application to the substrate, or as a subsequent step after the surrounding material is formed on the substrate.

Specifically, the invention provides a method of forming a one-dimensional nanoelement of a desired conductivity, comprising:

(a) forming a one-dimensional nanoelement on a substrate, the nanoelement being formed of a first material;

(b) forming at least a first layer of a further material on the substrate and surrounding, at least partially, the nanoelement, the further material having a first conductivity type dopant material therein, and (c) processing the further material so that said dopant material diffuses into the nanoelement, whereby to create a desired conductivity therein.

Additionally, the invention provides a nanoengineered structure, comprising a one-dimensional nanoelement, of a first material, disposed on a substrate, and at least a first layer of material formed on the substrate and surrounding, at least partially, the nanoelement, the first layer having a first conductivity type dopant material therein, said first conductivity type dopant material having diffused into the nanoelement, whereby to create a desired conductivity within the nanoelement.

In a further aspect, a pn junction is created within a one-dimensional nanoelement, preferably a nanowhisker. A nanowhisker is grown on a substrate, and embedded in a surrounding material. The material consists of first and second layers, formed on the substrate, one on top of the other, for example as polymer layers evaporated or spun onto the substrate. Alternatively the layers may be of some other material, for example dielectric material or semiconducting material grown on the substrate. The first layer extends partway up the nanowhisker, and has a first dopant material incorporated within it or subsequently injected, providing charge carriers of a first type. The second layer extends towards the top of the nanowhisker, and has a second dopant material contained within it or subsequently injected into it, providing charge carriers of an opposite conductivity type. The surrounding material is treated, as for example by rapid thermal annealing, so that the dopant ions themselves diffuse into the respective first and second regions of the nanoelement, to create an effective pn junction within the nanowhisker. In this case, the surrounding layers may be commercially available polymer layers evaporated or spun onto the substrate. The dopant materials are incorporated into the polymer materials before, during, or after the application of the polymer materials to the substrate.

In either case, the effective pn junction can be made as sharp as desired, approaching that of a few nanometers. More than one pn junction may be created by employing multiple layers, each layer having appropriate dopant material.

Specifically the invention provides a nanoengineered structure including a one-dimensional nanoelement with at least one pn junction therein, comprising a nanowhisker upstanding from a substrate, and a first layer of a material formed on the substrate and surrounding and extending partway up the nanowhisker, the first layer having a first conductivity type dopant material therein, and a second layer of material formed on top of the first layer and surrounding and extending towards the top of the nanowhisker, and having a second conductivity type dopant material therein, whereby to create by diffusion from said first and second layers into respective first and second regions of the nanowhisker, a pn junction within the nanowhisker between the first and second regions.

The invention also provides a method of forming a one-dimensional nanoelement with a pn junction therein, comprising:

(a) forming a nanowhisker upstanding from a substrate, (b) forming a first layer of material on the substrate and surrounding and extending partway up the nanowhisker, the first layer having a first conductivity type dopant material therein, and (c) forming a second layer of material on top of the first layer and surrounding and extending towards the top of the nanowhisker, and having a second conductivity type dopant material therein, so that diffusion from the first and second. layers into respective first and second regions of the nanowhisker creates a pn junction within the nanowhisker between the first and second regions.

In a fifth aspect, the invention recognises that there are problems in chemical doping of dopant ions in a nanowhisker of III-V semiconductor material, since for most III-V semiconductors, solid solubility at room temperature is limited, and during cooling out-diffusion is fast with these nanodimensions. Thus the amount of doping within the nanowhisker may be difficult to accurately predetermine. The invention recognises that the interface between a nanoelement and a surrounding medium, or a heterojunction interface within a nanoelement, may have a stronger and more significant role than hitherto realised in determining the electrical characteristics of the nanoelement.

It is known that localised surface "trap" states exist at the surfaces of bulk semiconductors; this is exhibited for example in Schottky diodes. This creates what is known as Fermi Level Pinning, where the surface trap states determine the relative levels of the conduction and valence bands in the junction materials. See, e.g., "Defective Heterojunction Models", Freeouf J L, Woodall J M,: IBM Corp,: *Surface Science*, 1986, V 168, N1-3, P 518-530.

The invention recognises that for a one-dimensional nanoelement, where there may be a wide range of possibilities to combine III-V semiconductors in spite of lattice mismatch, Fermi Level Pinning is a constructive way to make pn-junctions by choosing semiconductor alloy composition to determine carrier type. In such devices the band gap can be engineered and the carrier type can be controlled to make new types of semiconductor devices. When a semiconductor crystal ends abruptly at an interface, and "band bending" tends to occur to equalize the Fermi Levels on the two sides of the interface, Fermi Level Pinning, arising from the existence of surface trap states, counteracts this effect to reduce the amount of charge transfer across the interface.

The invention further provides a one-dimensional nanoelement including a first segment of a first semiconductor crystalline material, and a second segment of a second semiconductor crystalline material different from that of the first, and with a heterojunction therebetween, whereby the first and second materials are selected such that charge carriers of opposite conductivity type are provided at the opposite sides of the heterojunction interface so as to create a pn junction with predetermined characteristics, which characteristics are at least partially determined by Fermi level pinning.

The invention also provides a method of forming a pn junction comprising:

a. forming a one dimensional nanoelement having a first segment of a first crystalline material, and a second segment of a second crystalline material different from that of the first, with a heterojunction therebetween, b. the first and second materials being selected so as to provide charge carriers of opposite conductivity type at the heterojunction so as to create a pn junction with predetermined characteristics, which characteristics are at least partially determined by Fermi level pinning.

In accordance with the invention, the charge carriers can be provided by the intrinsic nature of the first and second materials. For III-V materials, stoichiometric compositions of ternary or quaternary materials can be chosen for desired conductivity characteristics.

It has been found that the present invention is particularly applicable to III-V compounds epitaxially grown (CBE or MOCVD, or MOVPE), under group III rich conditions. Under these conditions, the outermost atomic surface layers may have excess Ga or In ions and these create defect states, as further described herein.

BRIEF DESCRIPTION OF THE DRAWINGS

Preferred embodiments of the invention will now be described with reference to the accompanying drawings, wherein:

FIG. 6 is a cross-sectional schematic view of a fourth embodiment of the invention.

FIG. 7 is a cross-sectional schematic view of a fifth embodiment of the invention.

DESCRIPTION OF THE PREFERRED EMBODIMENTS

The embodiments to be described are all formed with nanowhiskers, preferably according to the Chemical Beam Epitaxy method (CBE) described in copending U.S. patent application Ser. No. 10/613,071 filed Jul. 7, 2003, the contents of which are herein incorporated by reference.

As indicated above, in the following detailed description of the invention, the term "nanoengineered structures" signifies a structure that includes structures, e.g., elements, parts, or the like, having dimensions as defined above, i.e., structures having at least two dimensions less than about 1 micrometer. Such structures are referred to herein as "nanoelements" or nanostructures, and/or, because of their generally elongated shape, as "nanowhiskers" or "nanowires".

Chemical Beam Epitaxy (CBE) combines a beam epitaxial technique like Molecular Beam Epitaxy (MBE) and the use of chemical sources similar to Metal Organic Chemical Vapor Deposition (MOCVD). In MOCVD or related laser ablation techniques, the pressure inside the reactor is usually greater than 10 mbar and the gaseous reactants are viscous, which means that they have a relatively high resistance to flow. The chemicals reach the substrate surface by diffusion. CBE reduces the pressure to less than $10^{-4}$ mbar and the mean free path of the diffusants then becomes longer than the distance between the source inlet and the substrate. The transport becomes collision free and occurs in the form of a molecular beam. The exclusion of the gas diffusion in the CBE system means a fast response in the flow at the substrate surface and this makes it possible to grow atomically abrupt interfaces.

Figure 1:
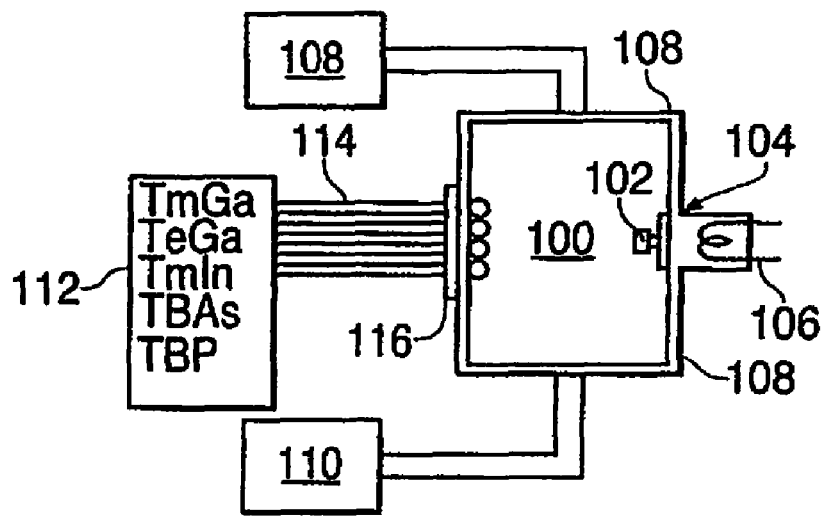
FIG. 1 is a schematic of the CBE apparatus used for making the described embodiments.

The CBE apparatus shown in FIG. 1 consists of a UHV growth chamber 100 where the sample 102 is mounted on a metal sample holder 104 connected to a heater 106. Around the chamber there is a ring 108 filled with liquid nitrogen that is called the cryoshroud. The cryoshroud pumps away species that don't impinge or that desorb from the substrate surface. It prevents contamination of the growing surface layer and reduces the memory effect. Vacuum pumps 110 are provided.

The sources 112 for CBE are in liquid phase and they are contained in bottles which have an overpressure compared to the chamber. The sources are usually as follows; TMGa, TEGa, TMIn, TBAs, and TBP. The bottles are stored in constant-temperature baths and by controlling the temperature of the liquid source, the partial pressure of the vapor above the liquid is regulated. The vapor is then fed into the chamber through a pipe complex 114 to, in the end of the pipe just before the growth chamber, a source injector 116. The source injector is responsible for injection of the gas sources into the growth chamber 100, and for generation of a molecular beam with stable and uniform intensity. The III-material, from the metal organic compounds TMIn (trimethylindium), TMGa (trimethylgallium) or TEGa (triethylgallium), will be injected by low temperature injectors to avoid condensation of the growth species. They will decompose at the substrate surface. The V-material is provided by the metal-organic compounds, TBAs (tertiarybutylarsine) or TBP (tertiarybutylphosphine). As opposed to the decomposition of the III-material, the V-material will be decomposed before injection into the growth chamber 100, at high temperatures, in the injectors 116. Those injectors 116 are called cracking cells and the temperatures are kept around 900° C. The source beam impinges directly on the heated substrate surface. Either the molecule gets enough thermal energy from the surface substrate to dissociate in all its three alkyl radicals, leaving the elemental group III atom on the surface, or the molecule get desorbed in an undissociated or partially dissociated shape. Which of these processes dominates depends on the temperature of the substrate and the arrival rate of the molecules to the surface. At higher temperatures, the growth rate will be limited by the supply and at lower temperatures it will be limited by the alkyl desorption that will block sites.

This Chemical Beam Epitaxy method permits formation of heterojunctions within a nanowhisker, which are abrupt, in the sense there is a rapid transition from one material to another over a few atomic layers.

Figure 2:
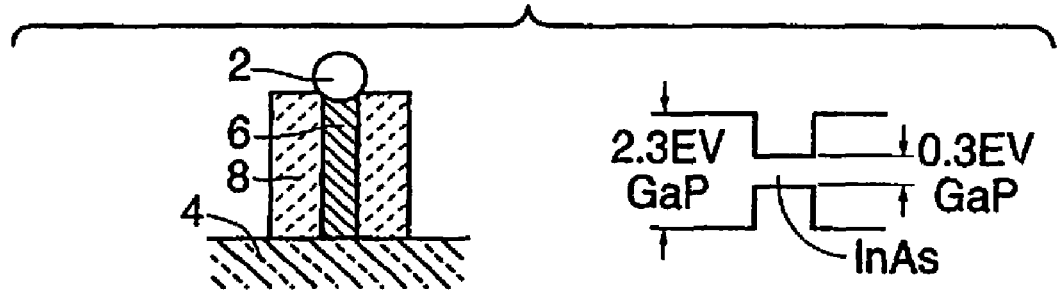
FIG. 2 is a cross-sectional schematic view showing a step in the formation of the first embodiment of the invention, with an accompanying energy band diagram.

Referring now to FIG. 2, a first embodiment of the invention is formed by positioning a gold aerosol particle 2 on a III-V substrate 4, e.g., a gallium arsenide substrate. With appropriate conditions of temperature and pressure a nanowhisker of indium arsenide is grown by injecting organic materials TMIn and TBAs in a conventional VLS procedure, e.g., in a chemical beam epitaxial method, using the apparatus described above, or by a metal organic vapor phase epitaxy (MOVPE), or the like. Indium and arsenide ions are absorbed in the gold particle 2 and supersaturation conditions create a solid pillar 6 of indium arsenide.

Once the indium arsenide whisker has been grown, different materials TEGa and TBP are used to create a coaxial jacket or surrounding layer 8 of GaP around the nanowhisker 6. Layer 8 may be created by CBE; using the apparatus of FIG. 1, wherein the conditions of temperature (106) and/or pressure (112) are changed to inhibit growth by the VLS mechanism, and instead to support bulk growth. Alternatively the gold melt particle 2 can be removed mechanically, so that subsequent growth of GaP will occur in bulk form.

The resulting energy level bandgap diagram is shown with an energy gap of 2.3 EV separating the conduction bands for gallium phosphide, whereas there is a bandgap of 0.3 EV for the central indium arsenide whisker.

The jacket or shell material (GaP in this case) may then be doped, e.g., via the vapor phase, resulting in a sheath at the periphery of the GaP jacket which will contain donor dopants such as tellurium.

As an alternative to tellurium, any donor dopant materials that are commonly used for GaP may be used, see for example CRC The Handbook of Chemistry and Physics, Semiconductor Properties, e.g., Si, Sn, Te, Se, S, or the like. Alternatively, if an acceptor-doped jacket or shell is desired, appropriate acceptor materials, e.g., Zn, Fe, Mg, Be, Cd, or the like, can be incorporated.

As an alternative to InAs/GaP, any other combination of materials may be used, subject to the bandgaps providing energetically favorable conditions—the band gap of the surrounding layer should be wider than that of the nanowhisker; thus for a whisker of InAs, covering materials of GaAs, GaP or InP may be employed—see for example CRC The Handbook of Chemistry and Physics, Semiconductor Properties.

The effect of doping with tellurium ions is to liberate charge carrier electrons within gallium phosphide layer 8. These electrons preferentially transfer into the central nanowhisker, where the energy states (conduction band/valence band levels) determine that the electrons are in energetically favorable condition. The theory is essentially that of modulation doping that is a technique employed in planar technology as described in WO 02/1438.

This therefore creates a nanowhisker with a desired electrical conductivity. The nanowhisker also has a high mobility because there are no dopant ions within the crystal lattice deforming the lattice structure.

Figure 3A:
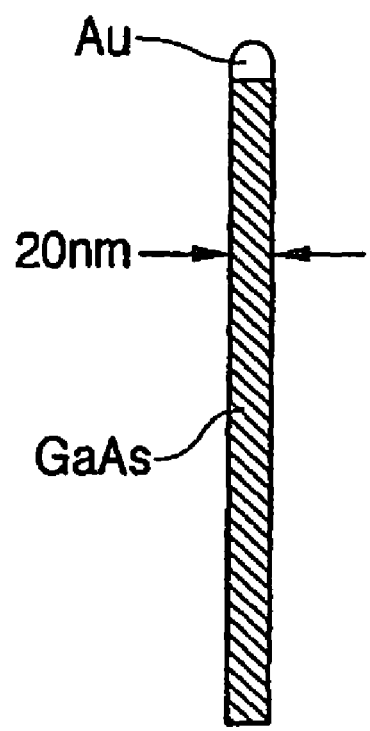
FIG. 3A shows a cross-section of a nanowhisker prepared by the VLS method.
Figure 3B:
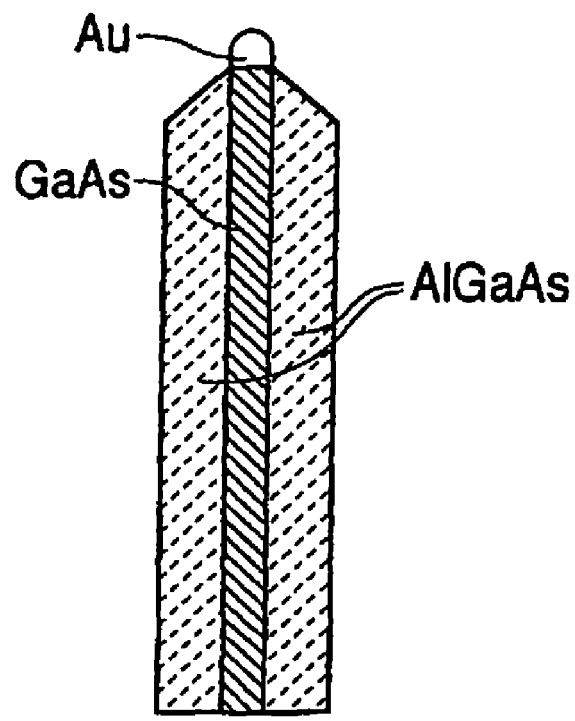
FIG. 3B shows a cross-section of a nanowhisker having an enclosure or jacket according to the invention.
Figure 3C:
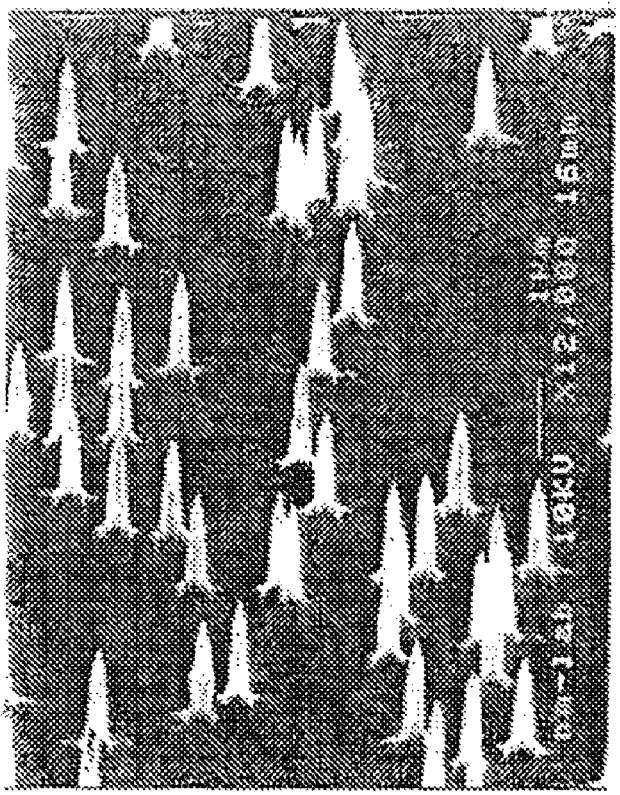
FIG. 3C shows an array of such clad nanowhiskers extending from a (111) surface.

Referring now to FIGS. 3A to 3F there is shown a specific example of the first embodiment of the invention. Nanowhiskers 6 of gallium arsenide were grown from gold catalytic particles by an epitaxial process from a GaAs substrate having a (111) surface. The growth conditions were then changed by altering the temperature, and modifying the gaseous pressure of the As-containing gas, so as to grow epitaxially, by bulk growth rather than catalytic growth, material of AlGaAs along the side of the GaAs nanowhiskers. The result as shown in FIGS. 3B and 3C are cylinders, in the form of a candle, with an inner core 6 of a GaAs 20 nanometers in diameter, and an outer cladding 8 of AlGaAs between 100 and 5000 nanometers in diameter.

FIG. 3C shows an array of such clad nanowhiskers extending from a (111) surface.

Figure 3D:
FIG. 3D shows an enlarged view of a nanowhisker having been separated from the surface.

FIG. 3D shows an enlarged view of a nanowhisker having been separated from the surface.

Figure 3E:
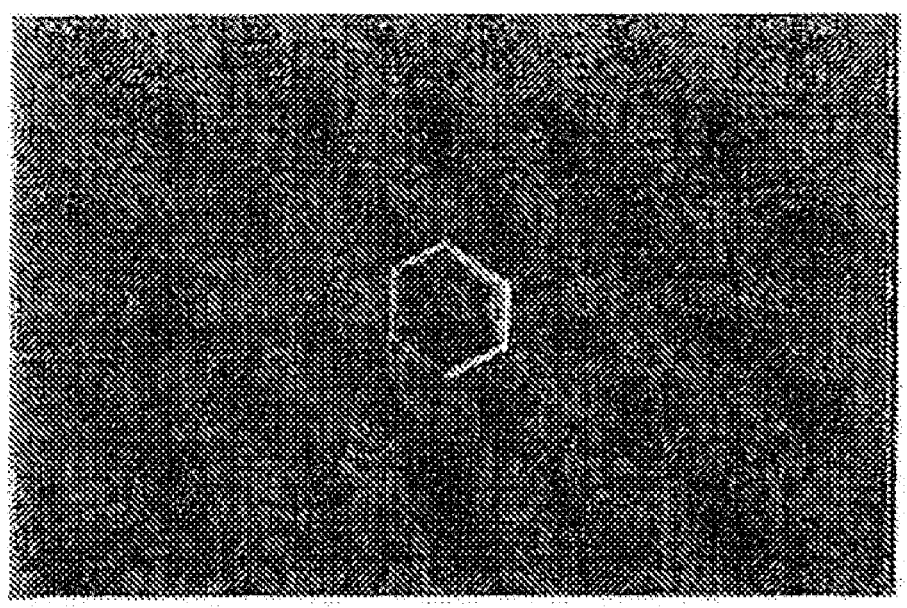
FIG. 3E is a view of the cross-section of the clad nanowhisker showing a hexagonal structure that is characteristic of nanowhiskers growing in a <111> direction.

FIG. 3E is a view of the cross-section of the clad nanowhisker showing a hexagonal structure that is characteristic of nanowhiskers growing in a <111> direction.

Figure 3F:
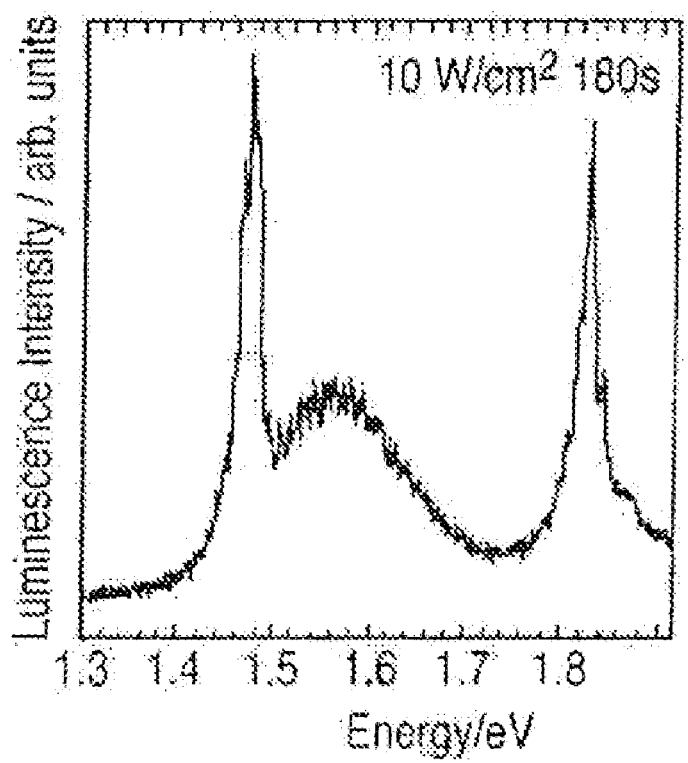
FIG. 3F is a luminescence curve showing characteristic peaks at approximately 1.5 and 1.8 eV, which represent GaAs and AlGaAs materials respectively.

FIG. 3F is a luminescence curve showing characteristic peaks at approximately 1.5 and 1.8 eV, which represent GaAs and AlGaAs materials respectively. An intermediate hump is thought to be caused by spatially indirect transitions.

Figure 4:
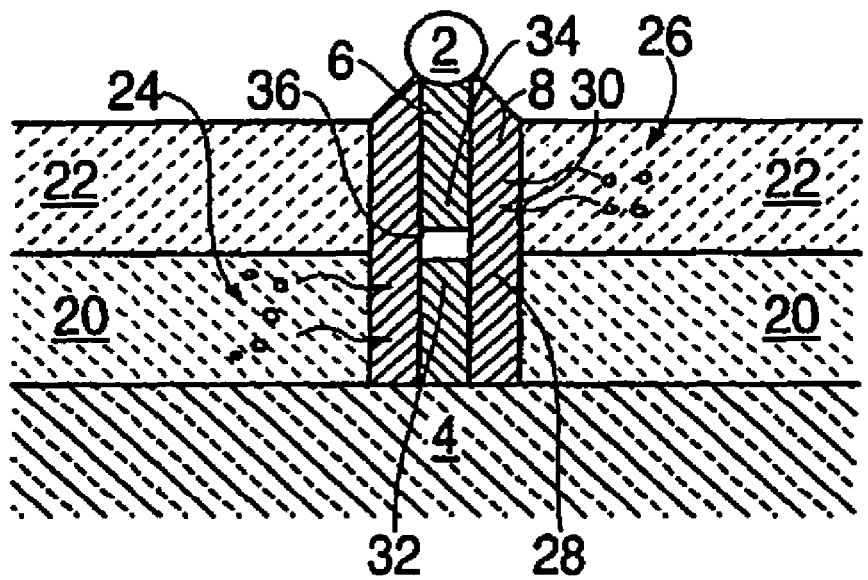
FIG. 4 is a cross-sectional view of a second embodiment of the invention.

Referring now to FIG. 4 there is shown a second embodiment of the invention. Similar parts to those of FIG. 2 are identified by the same reference numeral. A structure is produced comprising an inner nanowhisker of GaAs material 6, produced from a catalytic particle 2. The whisker is surrounded by a coaxial jacket 8 of AlGaAs. Then, first and second layers 20, 22 are provided, being of polymer or glass material spun on to the surface of substrate 4. Layer 20 contains n type dopant ions 24, and layer 22 contains p type dopant ions 26. A rapid thermal annealing step ensures that dopant ions 24, 26 migrate into corresponding regions 28, 30 of coaxial jackets 8. The annealing step is controlled such that there is no appreciable diffusion into the nanowhisker 6.

The result is that the dopant ions within regions 28, 30 create corresponding regions 32, 34 within nanowhisker 6 by modulation doping of opposite conductivity type. These regions that are stable space charge regions create a region 36 depleted of free carriers resembling the depletion region of a pn junction between semiconductor materials of opposite conductivity type.

The level of dopant concentration within regions 28, 30 may be such that highly degenerative doping is produced, with correspondingly heavy modulation doping of the segments 32, 34 of the nanowhisker. Such heavy modulation doping may create a condition analogous to that existing in an Esaki or tunnel diode, with corresponding tunnelling between the regions and an associated negative resistance effect.

Figure 5:
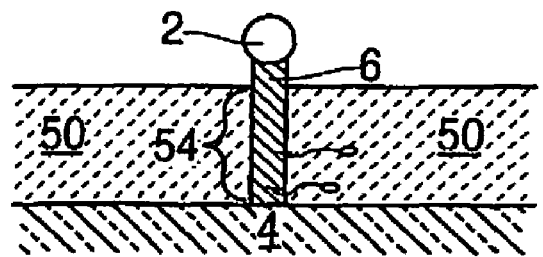
FIG. 5 is a cross-sectional schematic view of a third embodiment of the invention.

Referring now to FIG. 5, there is shown a third embodiment of the invention, wherein similar parts to those of FIG. 2 are denoted by the same reference numeral. Thus an indium arsenide nanowhisker 6 is grown on a gallium arsenide substrate 4 by chemical beam epitaxy employing a gold catalytic particle 2.

After formation of the nanowhisker, a first layer 50 of polymer material is evaporated (preferred) or spun onto the substrate 4. There is commercially available a wide range of dielectric materials formed of carbon or silicon based polymers, some of which are doped and have defined electrical conductivity characteristics. The polymer material has contained within it a desired concentration of dopant ions of a desired type. As may be seen, layer 50 extends towards the top of the nanowhiskers. The depth of layer 50 can be determined very accurately with evaporation of polymer.

The entire structure is then subject to rapid thermal annealing. This permits the dopant ions in the polymer material layer 50 to diffuse into the nanowhisker regions 54, to provide a controlled doping of the regions 54. The temperature of the annealing step depends on the materials employed.

There is thus provided a nanowhisker with a desired degree of conductivity, the method of doping providing a high degree of control over the conductivity.

Referring now to FIG. 6, there is shown a fourth embodiment of the invention, wherein similar parts to those of FIG. 2 are denoted by the same reference numeral. Thus an indium arsenide nanowhisker 6 is grown on a gallium arsenide substrate 4 by chemical beam epitaxy employing a gold catalytic particle 2.

After formation of the nanowhisker, a first layer 60 of polymer material is evaporated (preferred) or spun onto the substrate 4. There is commercially available a wide range of dielectric materials formed of carbon or silicon based polymers, some of which are doped and have defined electrical conductivity characteristics. The polymer material has contained within it a desired concentration of dopant ions of a desired type. As may be seen, layer 60 extends roughly halfway along the length of the nanowhisker. Thus, for a nanowhisker that is 2 micrometers long, the depth of layer 60 is 1 micrometer. The depth can be determined very accurately with evaporation of the polymer.

A second layer 62 of polymer material of the same type as the first but having a dopant material of opposite conductivity type is evaporated on to layer 60 and extends up to the top of the nanowhisker, to a height approximately the same as the gold particle 2.

The entire structure is then subject to rapid thermal annealing. This permits the dopant ions in the polymer material layer 60 to diffuse into the adjacent nanowhisker region 64, to provide a controlled doping of the region 64. Further, the dopant ions in the polymer material layer 62 diffuse into the adjacent nanowhisker region 66, to provide a controlled doping of the region 66. The temperature of the annealing step depends on the materials employed.

Thus, region 64 of whisker 6 may contain for example negative charge carriers, whereas positive charge carriers from layer 62 are contained in region 66 of whisker 6. This effectively creates a pn junction 68 between the two regions 64, 66.

The junction 68 may be sharply defined within the nanowhisker. For types of dopant materials, any of the commonly used materials may be used. See, e.g., CRC The Handbook of Chemistry and Physics, Semiconductor Properties.

Three or more layers of polymer may be deposited, each with appropriate dopant materials. This permits the formation of multiple pn junctions within the whisker.

Referring now to FIGS. 7 to 10, there is shown fifth and sixth embodiments of the invention. In FIG. 7 a nanowhisker is shown upstanding from a substrate 70, having a gold catalytic particle 72 at its top, and being composed of a material 74, preferably a III-V compound such as GaAs, InAs, InP. The nanowhisker has its sides defined by (110) surfaces. The whisker is formed by the CBE method as described above. The nanowhisker is embedded in a surrounding layer 76 of a second material different from that of the first, but preferably also a III-V compound such as GaAs, InAs, InP. The material of region 74 may be gallium arsenide, whereas material region 76 may be indium arsenide. Material region 76 is also grown by CBE, with conditions of temperature and/or pressure adjusted to support bulk growth, rather than VLS growth.

Preferably, nanowhiskers of III-V compounds are grown under group-III rich growth conditions (In, Ga, Al, B) that is for example an excess of TEGa is used for CBE growth of whiskers containing Ga. This ensures that the outermost surface of the nanowhisker has a slight excess of the group III compound Ga, and is therefore intrinsically p-type. The embedding layer 76 is InP, which embedding layer also grown under group III rich conditions to ensure a slight excess of In. The outermost surfaces of the nanowhisker are (110) surfaces.

Thus, a pn junction results by combining GaAs (p-type intrinsically) with InP (n-type intrinsically). Another example would be InAs, which is almost degenerately n-type intrinsically.

By way of explanation, it is well understood that, at the free surface of a semiconductor, surface relaxation and surface reconstruction may take place, to minimise free energy, in particular from charge imbalance. Surface reconstruction may involve rearrangement of the crystal lattice; this is particularly so for GaAs (111) surfaces. Further, surface trap states are created in the bulk band gap, and this strongly modifies the charge balance at the surface. This creates, in known manner, a deformation of the band structure near the surface. The band edges bend upwards so that the surface states cross the Fermi level and start to empty, decreasing the surface charge density. The region over which the bands are bent is termed the depletion region because it has been depleted of mobile carriers. If the surface state density at a semiconductor surface has a high value, the band bending will saturate. At this point the Fermi level is said to be pinned by the surface states.

Since in this embodiment, the nanowhisker is grown under group III rich conditions, the surface reconstruction creates, from these excess group III atoms, deep-level like defects, the energy position of which are related to the vacuum level, not to the band edges of the semiconductors (this corresponds to the situation for other deep level impurities in bulk III-V semiconductors).

Figure 9:
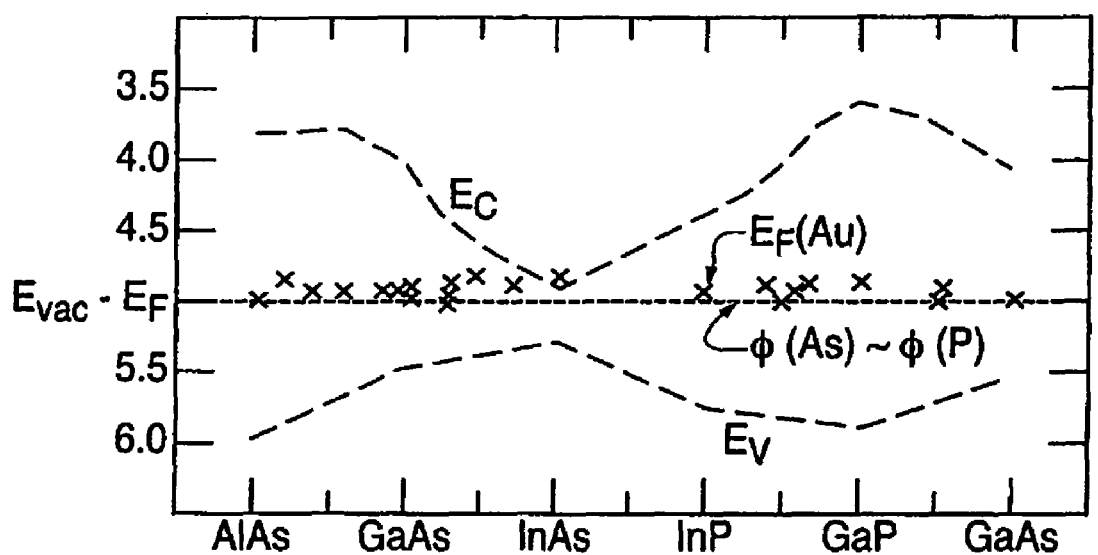
FIG. 9 is a graph showing the energy levels of the bands and surface states of a number of semiconductor materials.

Referring to FIG. 9, this shows the band gaps for a range of III-V compounds grown under group III rich conditions, with surface trap states indicated by crosses occurring in the band gaps. It will be noted that for all the compounds, the energy levels for the trap states are roughly equal, relative to vacuum level. This implies that pn junctions can simply be created by Fermi Level pinning at an interface between two such materials.

Figure 10:
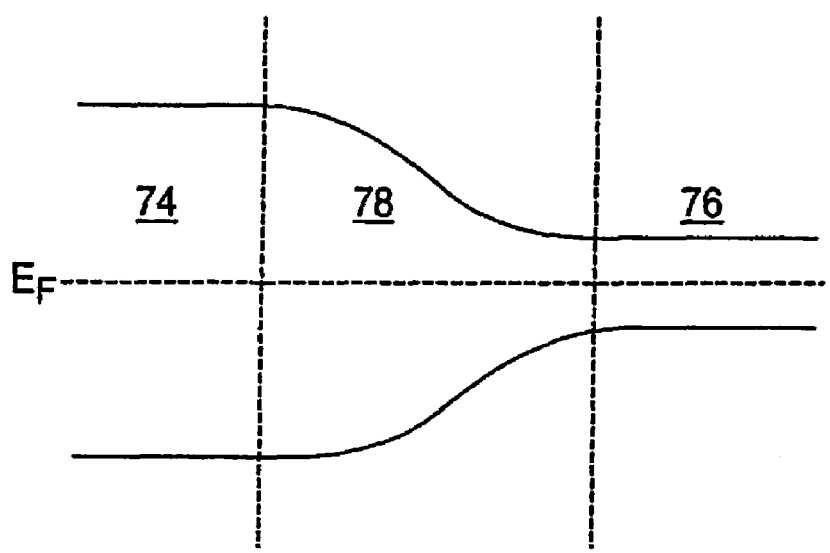
FIG. 10 is a schematic energy level diagram for the doped nanowhiskers of FIG. 7 and FIG. 8.

Thus, the situation arises that the surface of a GaAs whisker is p-type, whereas the surface of an InP whisker is n-type. Further the surface of layer 76 surrounding and embedding the whisker will have a conductivity governed by similar considerations. Thus Fermi Level pinning will ensure that the surface of a surrounding InP layer is n-type; hence if the whisker is GaAs, a pn junction is created by the Fermi Level Pinning effects. The situation is shown in FIG. 10, where the relative levels of the band gaps of GaAs and InP are determined by Fermi Level Pinning, arising from the surface trap states.

In an alternative, where the whisker and surrounding layer are grown by MOVPE, then the MOVPE process has to be tuned to give Group III rich conditions of growth.

Figure 8:
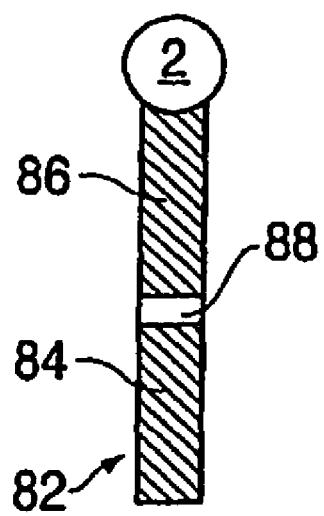
FIG. 8 is a cross-sectional schematic view of a sixth embodiment of the invention.

In a further embodiment as shown in FIG. 8, a heterojunction 88 within a nanowhisker 82 between an indium phosphide segment 84 and a gallium arsenide segment 86 assumes the character of a pn junction along a (001) or (100) crystal plane. This is because GaAs is intrinsically p-type whereas indium phosphide is intrinsically n-type. The side facets of the whisker are (111) planes that have many surface states which establish a surface Fermi level (pinned Fermi level) which is characteristic of p-type or n-type semiconductor material, respectively. For nanowhiskers of a diameter of about 100 nm or less, there is insufficient diametral distance to permit band bending in the interior of the whisker to a level characteristic of the bulk semiconductor. Consequently, the conductivity type of each of the segments 82, 84 is determined by the Fermi-level pinning produced by the surface states on the side facets of each segment. Accordingly, the heterojunction 88 becomes a pn junction between the indium phosphide segment 84 and the gallium arsenide segment 86 of the nanowhisker.

The skilled practitioner will, of course, recognize that the above-described embodiments are illustrative of the present invention and not limiting.

The invention claimed is:

1. A semiconductor device, comprising:
   a III-V semiconductor nanowhisker of a first conductivity type standing upright from a substrate; and
   a bulk III-V semiconductor layer of a second conductivity type located around at least a portion of the nanowhisker;
   wherein:
   the bulk III-V semiconductor layer has a thickness greater than 200 nm; and
   the III-V semiconductor nanowhisker and the bulk III-V semiconductor layer comprise portions of a semiconductor junction.

2. The device of claim 1, wherein the first conductivity type comprises n-type and the second conductivity type comprises p-type.

3. The device of claim 1, wherein the first conductivity type comprises p-type and the second conductivity type comprises n-type.

4. The device of claim 1, wherein the nanowhisker comprises a one dimensional nanoelement.

5. The device of claim 1, wherein the substrate comprises a III-V semiconductor substrate.

6. The device of claim 1, wherein the nanowhisker is formed on the substrate by a VLS process using a gold particle, and the gold particle is located on top of the nanowhisker.

7. The device of claim 1, wherein the semiconductor junction comprises a pn junction.

* * * * *